United States Patent [19]
Corbett et al.

[11] Patent Number: 5,179,506
[45] Date of Patent: Jan. 12, 1993

[54] SECURING COMPONENT ARRANGEMENT

[75] Inventors: Robert Corbett, Rolling Meadows; Peter Shak, Hoffmann Estates; Jack Meagher, Prospect Heights; Dennis Stephens, Niles; Youngkee Ahn, Buffalo Grove, all of Ill.

[73] Assignee: Motorola Lighting, Inc., Buffalo Grove, Ill.

[21] Appl. No.: 677,925

[22] Filed: Apr. 1, 1991

[51] Int. Cl.⁵ .................. H05K 7/02; H05K 7/20
[52] U.S. Cl. .................... 361/417; 361/386; 361/388; 361/419; 361/420; 361/394
[58] Field of Search ........ 361/386, 388, 389, 392–395, 361/399, 417, 419, 420; 357/81

[56] References Cited
U.S. PATENT DOCUMENTS 4,891,735  1/1990  Mikolajczak ................ 361/386
4,923,179  5/1990  Mikolajczak ................ 361/386

Primary Examiner—Gregory D. Thompson
Attorney, Agent, or Firm—J. Ray Wood

[57] ABSTRACT

An arrangement for securing a power transistor (4, 6, 8) or like component which is inserted into a printed circuit board (2) in a vertically downward direction. The printed circuit board is housed in a housing (20, 60) whose lower part (20) has upstanding walls (24, 26) with pairs of vertical slots (4A & 4B, 6A & 6B, 8A & 8B). Spring clips 52 are inserted vertically downwardly so that their legs (52A, 52B) engage in the slots and their center portions (54) urge the transistors toward the upstanding walls so that the housing acts as a heat sink for the transistors, obviating the need for additional components. Also, since all insertion is performed vertically from above, assembly can be performed straightforwardly by an automatic insertion machine, resulting in more rapid assembly and increased reliability.

3 Claims, 2 Drawing Sheets 3,179,506

1

SECURING COMPONENT ARRANGEMENT

FIELD OF THE INVENTION

This invention relates to the securing of components and particularly, though not exclusively, to the securing of electronic components such as transistors to heat sinks.

BACKGROUND OF THE INVENTION

Typically, in building an electronic component assembly, the components (such as transistors, resistors, capacitors and other discrete components together with integrated circuit components, if any) are mounted on a printed circuit board. Components, such as transistors, which in use generate significant amounts of heat are provided with heat sinks to enhance dissipation of the generated heat. In order for such a heat sink to provide optimum heat dissipation, the heat generating component must be in intimate contact with the heat sink so as to allow maximum heat transfer from the component to the heat sink.

One known method of securing a component and a heat sink is used with TO-220 packaged transistors which have a hole through which a bolt passes to bolt the transistor to the heat sink. However, such a method of securing does not lend itself to automated assembly.

Another known method of securing a component and a heat sink involves utilizing a snap-in clip which extends around the component and locates in holes in the heat sink in order to hold the component to the heat sink. However, the component is typically inserted into a planar printed circuit board from a direction perpendicular to the printed circuit board's plane and has a surface which extends perpendicularly to the board and which must be secured to the heat sink. Such an arrangement requires the clip to be inserted into the heat sink in a direction parallel to the plane of the printed circuit board. This method of securing does not lend itself straightforwardly to automated assembly using automated insertion machines.

SUMMARY OF THE INVENTION

In accordance with the invention there is provided a secure component arrangement comprising:
  a component;
  a base member into which the component is inserted in a first direction;
  a secondary member having an slot means; and
  a securing member which is inserted into said secondary member in said first direction and which has a first portion engaging said in said slot means of said secondary member and a second portion holding said component to said secondary member.

In such a secure component arrangement all insertion is performed vertically from above, allowing assembly to be performed straightforwardly by an automatic insertion machine, resulting in more rapid assembly and increased reliability.

BRIEF DESCRIPTION OF THE DRAWINGS

One electronic ballast unit for fluorescent lamps incorporating components secured in accordance with the present invention will now be described, by way of example only, with reference to the accompanying drawings, in which.

DESCRIPTION OF THE PREFERRED EMBODIMENT

Figure 1:
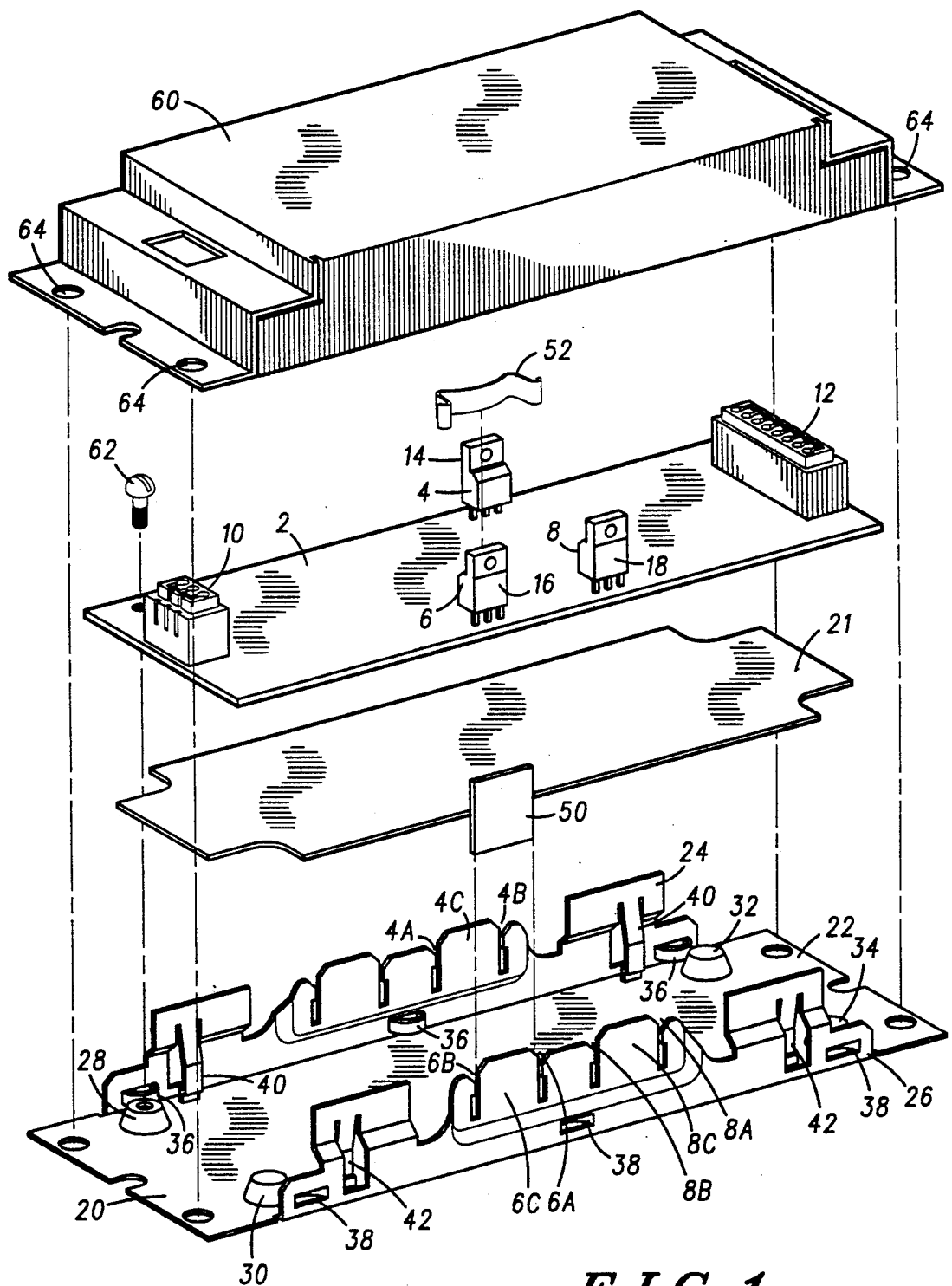
FIG. 1 shows an exploded elevational view of the ballast unit.

Referring now to FIG. 1, a printed circuit board 2 is fabricated in conventional manner by inserting vertically from above components such as power transistors 4, 6 and 8, external wiring connectors 10 and and other components (not shown), the components' leads locating in pre-formed holes in the printed circuit board 2. The insertion may conveniently be performed by an automatic insertion machine, examples of which are well known in the art. For reasons which will be explained below, the power transistors are arranged with their heat-generating surfaces 14, 16 and 18 respectively at the edges of the printed circuit board 2. The inserted components are soldered to the underside of the printed circuit board 2 by passing the board through a wave-soldering machine, examples of which are also well known in the art.

The soldered printed circuit board assembly is placed in the lower portion 20 of a two-piece housing, with an electrically insulating liner 21 being interposed between the underside of the printed circuit board 2 and the lower housing portion 20. The lower housing portion 20 is fabricated of stamped, folded sheet metal material and has a planar, rectangular base portion 22 and upstanding side walls 24 and 26. The base portion is provided with screw holes 28, 30, 32 and 34 adjacent each of its four corners. The upstanding side walls 24 and 26 are each provided with inwardly extending formations 36 and 38 respectively for spacing the printed circuit board 2 from the base portion 22 and inwardly extending resilient arms 40 and 42 respectively for latching the printed circuit board 2 in position in the lower housing portion 20.

Figure 2:
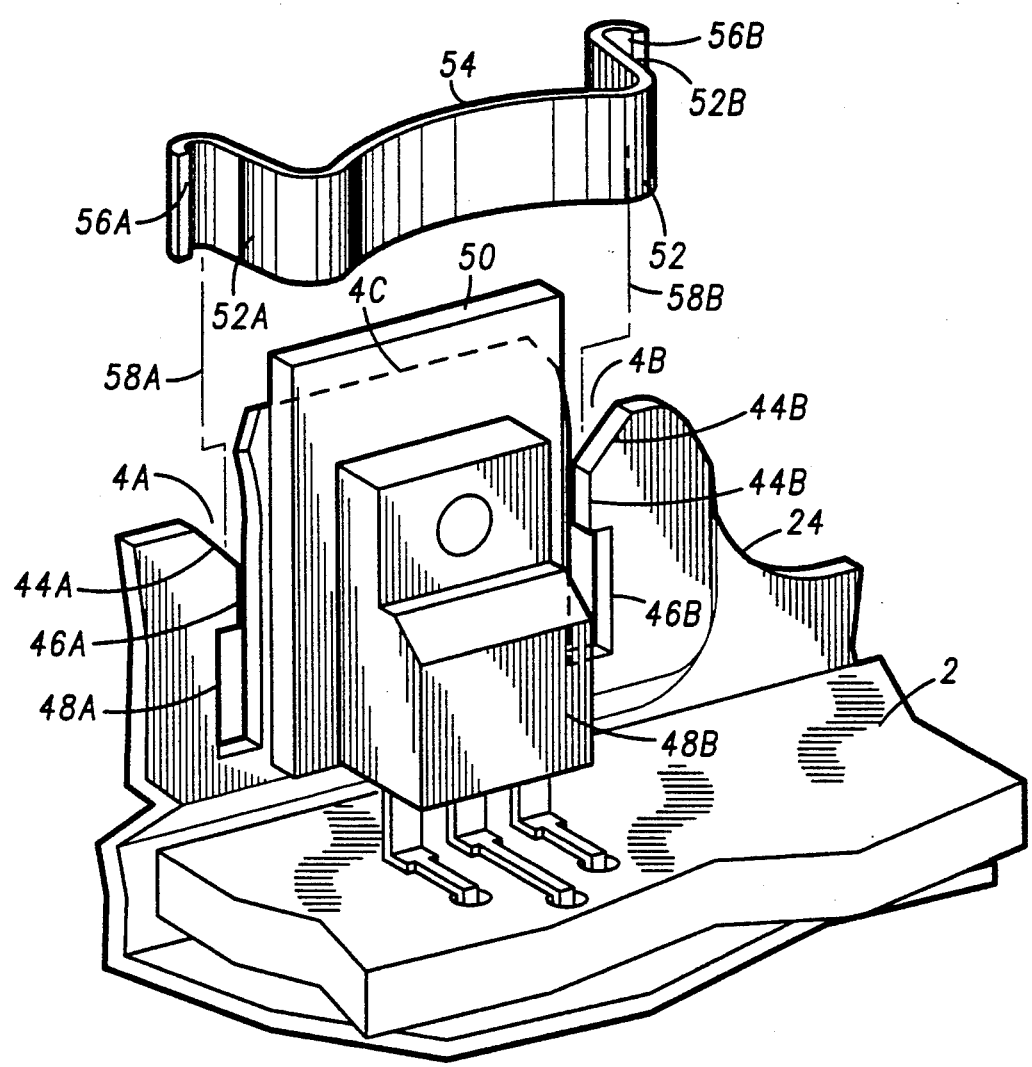
FIG. 2 shows an enlarged elevational view of part of the ballast unit illustrating the securing of a component.

Referring now also to FIG. 2, the side walls 24 and 26 are provided with pairs of downwardly extending slots 4A & 4B, 6A & 6B and 8A & 8B respectively adjacent each of the power transistors 4, 6 and 8. The slots are shaped so as to have, in vertically descending order: a tapered, narrowing portion 44A, 44B, an narrow portion 46A, 46B and a wider portion 48A, 48B. The pairs of slots 4A & 4B, 6A & 6B and 8A & 8B define wall portions 4C, 6C and 8C respectively therebetween. The heat-generating surfaces 14, 16 and 18 of the power transistors 4, 6 and 8 respectively align with the wall portions 4C, 6C and 8C respectively, and a heat-conducting thermal pad 50 is interposed respectively between the heat generating surface of each of the power transistors and its aligned wall portion.

Spring clips 52 are formed of resilient material (e.g. stamped, folded sheet-metal) and have two parallel legs 52A, 52B joined by a center portion 54. The legs 52A, 52B each have at their ends remote from the center portion an outwardly extending foot 56A, 56B respectively. The center portion 54 is convex with respect to the legs 52A, 52B. The spring clips 52 are inserted vertically from above into the pairs of slots 4A & 4B, 6A & 6B and 8A & 8B to hold the power transistors, heat generating surfaces to their aligned wall portions 4C, 6C and 8C, as follows.

Each clip is pre-stressed so as to flatten or reduce the convexity of the spring's center portion 54, and so increase the clearance of the spring between its center portion 54 and its feet 52A, 52B. Maintaining the pre-stressing, the spring clip 52 is then inserted vertically downwardly so that its center portion 54 clears the inner surface of its respective power transistor, the spring clip's legs 52A and 52B enter the tapered portions 44A and 44B respectively of a pair of the slots 4A & 4B, 6A & 6B and 8A & 8B and the spring clip's feet 52A and 52B are on the outer side of the relevant upstanding side wall 24 or 26. The movements of the spring clip's legs are illustrated by the arrows in FIG. 2.

As the spring clip is moved further down, the increasing narrowness of the tapered slot portions 44A and 44B force the legs 52A and 52B to move resiliently together, and this enforced close spacing of the legs is maintained as the spring clip moves further down and the legs pass through the narrow slot portions 46A and 46B. As the spring clip moves further down and the legs leave the narrow slot portions 46A and 46B and enter the wider slot portions 48A and 48B, the resilience of the legs 52A and 52B causes them to move outwardly. In this position the spring clip is fully engaged in the slot, since the legs cannot move upward (into the narrow slot portions 46A and 46B) without the application of some external force to move them together, and since the feet 56A and 56B prevent the spring clip from moving laterally inward toward the center of the lower housing portion 20. At this point the pre-stressing of the spring clip is removed, causing the resilience of the spring to move its center portion 54 back toward its previous, unstressed convex shape, and so causing the center portion 54 to press the heat generating surface 14, 16 or 18 of its associated power transistor 4, 6 or 8 against its associated wall portion 4C, 6C or 8C, through the intermediate thermal pad 50. In this way the power transistors 4, 6 and 8 are held secured against the upstanding side walls 24 and 26. Thus the upstanding side walls 24 and 26, together with the rest of the lower housing portion 20, act as a heat sink for the power transistors 4, 6 and 8 and obviate the need for separate heat sinks which would otherwise be required for the power transistors.

Finally an upper housing portion 60 is inserted vertically from above to cover the sub-assembly of the lower housing portion holding the printed circuit board 2 and its secured power transistors. Screws 62 are inserted vertically from above through holes 64 in the upper housing portion 60 and tightened into the screw holes 28, 30, 32 and 34 in the lower housing portion 20 to fasten the housing together and complete the assembly.

It will be appreciated that in the above-described assembly process all insertion is performed vertically from above, allowing the assembly to be performed straightforwardly by an automatic insertion machine without having to re-orient the workpiece. Thus, the assembly process lends itself to automation, resulting in more rapid assembly and increased reliability.

It will also be appreciated that in each spring clip 52 the center portion 54 and the legs 52A & 52B of the spring clip are spaced by a significant gap from the electrical leads of the clip's associated transistor. In this way, a satisfactorily high breakdown voltage (e.g 3KV) is easily maintained between the electrical leads of the transistors and the grounded clips 52 and housing portion 20.

It will also be appreciated that various other modifications or alternatives to the above described embodiment will be apparent to the person skilled in the art without departing from the inventive concept of securing a component inserted in a base by utilizing a securing member which is inserted into said secondary member in the same direction as the component and which has a first portion engaging a formation of the secondary member and a second portion holding the component to said secondary member.

We claim:

1. A secure component arrangement comprising:
   a component;
   a base member into which the component is inserted in a first direction;
   a secondary member having slot means, the slot means having at least one slot with a relatively narrow portion followed in said first direction by as relatively wide portion; and
   a securing member which is inserted into said secondary member in said first direction and which has a first portion engaging in said slot means of said secondary member by the first portion being inserted in and through the relatively narrow portion and engaging in the relatively wide portion, and a second portion holding said component to said secondary member.

2. An arrangement according to claim 1 wherein the first portion of the securing member is subject to resilient deformation at insertion in and through the relatively narrow portion, the resilient deformation being at least partly reduced in the relatively wide portion whereby the first portion of the securing member is retained in the relatively wide portion.

3. An arrangement according to claim 1 wherein the slot means comprises a pair of complementary slots and the first portion of the securing member comprises a pair of extending members for insertion respectively in the pair of slots.

* * * * *